United States Patent
Tanaka et al.

(10) Patent No.: US 8,659,056 B2
(45) Date of Patent: Feb. 25, 2014

(54) HETEROJUNCTION FIELD-EFFECT TRANSISTOR WITH SOURCE ELECTRODE AND INSULATOR FORMED IN SEMICONDUCTOR LAYER OPENING

(71) Applicant: Panasonic Corporation, Osaka (JP)

(72) Inventors: Kenichiro Tanaka, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/727,354

(22) Filed: Dec. 26, 2012

(65) Prior Publication Data

US 2013/0126943 A1    May 23, 2013

Related U.S. Application Data

(63) Continuation of application No. PCT/JP2011/003968, filed on Jul. 11, 2011.

(30) Foreign Application Priority Data

Jul. 14, 2010   (JP) .................................. 2010-160113

(51) Int. Cl.
*H01L 29/778*   (2006.01)
(52) U.S. Cl.
USPC ........................................................ 257/194
(58) Field of Classification Search
CPC ................................................... H01L 29/778

USPC .......................................................... 257/194
See application file for complete search history.

(56) References Cited

U.S. PATENT DOCUMENTS

| 7,821,036 | B2 | 10/2010 | Ehara |
| 2007/0284653 | A1 | 12/2007 | Ueno et al. |
| 2008/0258150 | A1* | 10/2008 | McCarthy et al. .............. 257/76 |
| 2008/0284022 | A1 | 11/2008 | Ehara |
| 2010/0090225 | A1* | 4/2010 | Sato ................................ 257/76 |
| 2011/0049574 | A1 | 3/2011 | Ueno et al. |

FOREIGN PATENT DOCUMENTS

| JP | 11-354817 A | 12/1999 |
| JP | 2007-329350 A | 12/2007 |
| JP | 2008-147524 A | 6/2008 |
| JP | 2009-099678 A | 5/2009 |

OTHER PUBLICATIONS

International Search Report mailed Aug. 23, 2011 issued in corresponding International Application No. PCT/JP2011/003968.

* cited by examiner

*Primary Examiner* — Walter H. Swanson
(74) *Attorney, Agent, or Firm* — McDermott Will & Emery LLP

(57) ABSTRACT

An insulator is formed on the upper surface of a first semiconductor layer on at least a part of a portion above which a second semiconductor layer is not formed due to an opening. In the opening, a source electrode is formed to cover an insulator. The source electrode is formed to be in contact with an interface between the first semiconductor layer and the second semiconductor layer.

6 Claims, 7 Drawing Sheets

US 8,659,056 B2

HETEROJUNCTION FIELD-EFFECT TRANSISTOR WITH SOURCE ELECTRODE AND INSULATOR FORMED IN SEMICONDUCTOR LAYER OPENING

CROSS REFERENCE TO RELATED APPLICATIONS

This is a continuation application of PCT Patent Application No. PCT/JP2011/003968 filed on Jul. 11, 2011 , designating the United States of America, which is based on and claims priority of Japanese Patent Application No. 2010-160113 filed on Jul. 14, 2010 . The entire disclosures of the above-identified applications, including the specifications, drawings and claims are incorporated herein by reference in their entirety.

TECHNICAL FIELD

The present invention relates to a field-effect transistor that is applicable to a power transistor used in a power circuit of consumer equipment.

BACKGROUND ART

In a nitride semiconductor, a band gap, a dielectric breakdown electric field, and a saturated drift velocity of an electron are larger than those in silicone (Si), GaAs, and the like. Moreover, in a heterostructure transistor formed on a substrate having a main surface of a (0001) plane and made from AlGaN/GaN, two-dimensional electron gas (hereinafter also referred to as 2 DEG) is generated in a hetero interface by spontaneous polarization and piezo polarization.

Therefore, in the heterostructure transistor, 2 DEG having a sheet carrier concentration of at least approximately $1\times10^{13}$ $cm^{-2}$ can be obtained without doping. In recent years, a high electron mobility transistor that uses highly concentrated 2 DEG as a carrier has drawn attention, and various HEMT structure (heterojunction) field-effect transistors are proposed.

FIG. 6 is a diagram showing a cross-section structure of a conventional field-effect transistor 500 in Patent Literature (PTL) 1. Hereinafter, the field-effect transistor is also referred to as a FET. Moreover, the FET is hereinafter also referred to as a device.

As shown in FIG. 6, in the field-effect transistor 500, a first semiconductor layer 510 (operation layer) made of a first nitride semiconductor (GaN) and a second semiconductor layer 520 (barrier layer) made of a second nitride semiconductor are stacked on a substrate 501. A band gap of the second nitride semiconductor is larger than a band gap of the first nitride semiconductor.

The second semiconductor layer 520 is formed on the first semiconductor layer 510, so that a heterojunction interface is formed. As a result, in a region in the vicinity of the heterojunction interface in the first semiconductor layer 510, a 2 DEG layer 511 is formed.

In the second semiconductor layer 520, openings 521.1 and 521.2 penetrating the second semiconductor layer 520 to reach (be in contact with) the first semiconductor layer 510 are formed.

It is to be noted that each of the openings 521.1 and 521.2 is formed to penetrate the 2 DEG layer 511 and reach a region below the 2 DEG layer 511.

A conductive material is buried inside the opening 521.1, so that a source electrode S50 that is an ohmic electrode is formed. Moreover, a conductive material is buried inside the opening 521.2, so that a drain electrode D50 that is an ohmic electrode is formed.

On the second semiconductor layer 520, a gate electrode G50 that is a schottky electrode is formed. Moreover, the gate electrode G50 is formed between the source electrode S50 and the drain electrode D50.

It is to be noted that a surface protection film 550 is formed on the source electrode S50, the drain electrode D50, and the gate electrode G50.

With this structure, the ohmic electrode and the 2 DEG layer are directly contact with each other, thereby decreasing contact resistance in the ohmic electrode. Hereinafter, the field-effect transistor 500 is referred to as a conventional FET.

CITATION LIST

Patent Literature

[PTL 1] Japanese Unexamined Patent Application Publication No. 2007-329350

SUMMARY

Technical Problem

However, the conventional FET is not capable of solving the following problem.

For example, in the conventional FET, resistance at the time of ON (on-resistance) can be reduced by increasing the width of the gate electrode (the width of a current path between the source and the drain).

However, in the first semiconductor layer 510 or the second semiconductor layer 520 in the conventional FET, a small pit may be present as shown in an electron micrograph in FIG. 7. The pit is a defect in the form of a void. When the pit is present, a breakdown voltage between the pit and the substrate decreases. In other words, the breakdown voltage in the FET (device) decreases. The breakdown voltage refers to a limit value in a voltage applicable to a device and the like.

As a result, the probability of the breakdown voltage in the FET (device) being less than a predetermined breakdown voltage for determining an acceptable FET (device) increases, and as such, the yield rate of the FET (device) decreases.

The present invention was conceived for solving the above-described problem, and has an object to provide a field-effect transistor which is capable of suppressing the decrease in the yield rate.

Solution to Problem

In order to solve the above-described problem, a field-effect transistor according to an aspect of the present invention includes: a substrate; a first semiconductor layer formed above the substrate and made of a first nitride semiconductor; a second semiconductor layer formed above the first semiconductor layer and made of a second nitride semiconductor having a band gap larger than a band gap of the first nitride semiconductor; an opening formed in the second semiconductor layer, the opening penetrating the second semiconductor layer to reach the first semiconductor layer; an insulator formed on an upper surface of the first semiconductor layer on at least a part of a portion above which the second semiconductor layer is not formed due to the opening; and an electrode formed in the opening to cover the insulator and to be in contact with an interface between the first semiconductor layer and the second semiconductor layer.

That is, an insulator is formed on an upper surface of the first semiconductor layer on at least a part of a portion above which the second semiconductor layer is not formed due to the opening. In the opening, an electrode is formed to cover the insulator. The electrode is formed to be in contact with an interface between the first semiconductor layer and the second semiconductor layer.

Here, it is assumed that a defect (for example, a pit) which can cause a decrease in a breakdown voltage is present under the insulator in the first semiconductor layer. In this case, the decrease in the breakdown voltage between the defect and the substrate can be suppressed by the insulator. That is, the decrease in the breakdown voltage in the field-effect transistor can be suppressed by the insulator.

With this, even when the defect which can cause the decrease in the breakdown voltage is present, it is possible to suppress a decrease in the probability of the field-effect transistor maintaining the breakdown voltage more than or equal to the predetermined breakdown voltage for determining an acceptable FET (device).

In other words, a decrease in a yield rate of the field-effect transistor can be suppressed.

Moreover, it is preferable that a two-dimensional electron gas layer is formed on a surface portion of the first semiconductor layer, the surface portion being a region in a vicinity of the interface between the first semiconductor layer and the second semiconductor layer, and the electrode is formed to penetrate the second semiconductor layer and the two-dimensional electron gas layer.

With this, the electrode is directly in contact with the two-dimensional electron gas layer. Therefore, contact resistance in the electrode can be decreased even when the insulator is formed.

Moreover, it is preferable that in the first semiconductor layer and the second semiconductor layer, a portion corresponding to an inner surface portion of the opening is doped with an n-type impurity.

Moreover, it is preferable that the portion corresponding to the inner surface portion of the opening includes an end portion of the interface between the first semiconductor layer and the second semiconductor layer.

Moreover, it is preferable that the field-effect transistor further includes a buffer layer, and in the field-effect transistor, the buffer layer, and the first semiconductor layer are stacked in this order.

Moreover, it is preferable that the insulator is made of at least any one of AlN, $SiO_2$, SiN, sapphire, diamond, and an insulating organic material.

Advantageous Effects

According the present invention, a decrease in a yield rate can be suppressed.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Figure 1:
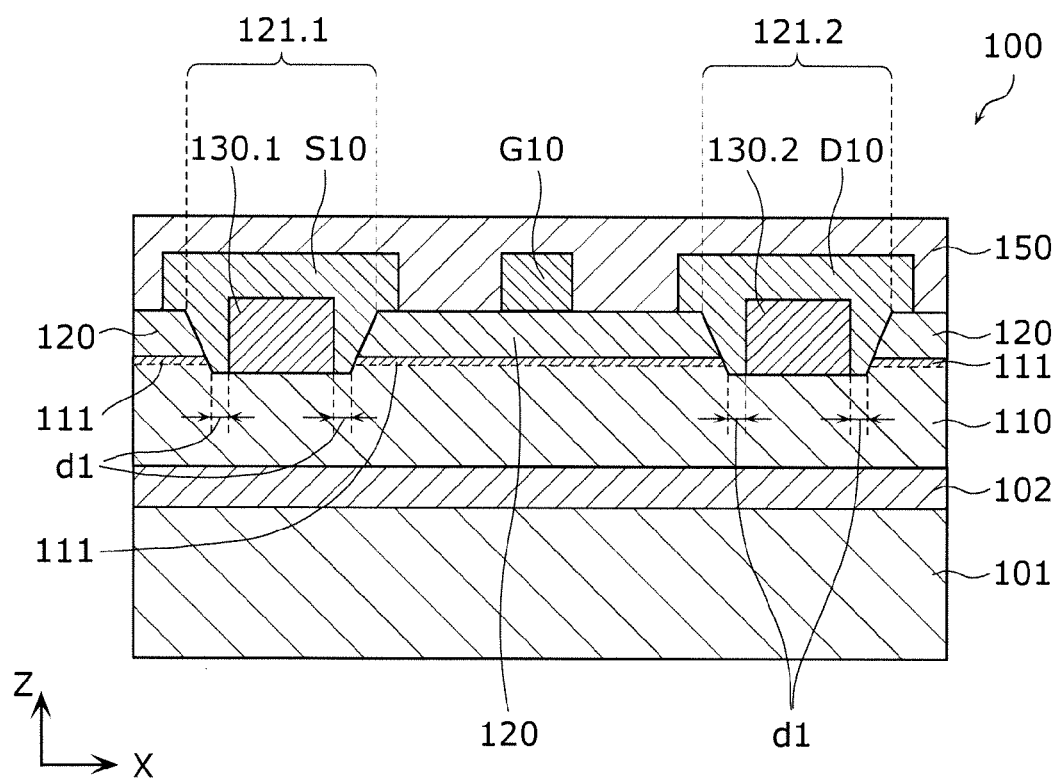
FIG. 1 is a diagram showing a cross-section structure of a field-effect transistor according to Embodiment 1.

The following describes embodiments of the present invention with reference to the drawings. In the following description, the same reference numerals are assigned to the same constituent elements, and the names and the functions are also the same. Thus, the detailed description thereof may be omitted.

It is to be noted that the size, the material, the shape, and the relative positions of each constituent element illustrated by examples in the embodiments are to be appropriately varied depending on a structure and various conditions of an apparatus to which the present invention is applied, and the present invention is not limited to such examples. Moreover, the size of the constituent elements in the drawings may be different from the actual size.

Embodiment 1

FIG. 1 is a diagram showing a cross-section structure of a field-effect transistor 100 according to Embodiment 1. The field-effect transistor 100 is a heterojunction field-effect transistor. Moreover, the field-effect transistor 100 is also a high electron mobility transistor (HEMT). It is to be noted that a surface protection film 150, which is not included in the field-effect transistor 100, is shown in FIG. 1. It is to be noted that the surface protection film 150 may be included in the field-effect transistor 100.

As shown in FIG. 1, the field-effect transistor 100 includes a substrate 101, a buffer layer 102, a first semiconductor layer 110, a second semiconductor layer 120, a source electrode S10, a drain electrode D10, a gate electrode G10, and insulators 130.1 and 130.2.

The substrate 101 is, for example, a p-type Si substrate.

The buffer layer 102 is formed on the substrate 101. The buffer layer 102 has a superlattice structure in which a set including aluminum nitride (AlN) buffer and a compound of AlN and gallium nitride (GaN) are formed in 100 cycles. The film thickness of the AlN buffer is, for example, 300 nm. The film thickness of the AlN in one cycle in the superlattice structure is, for example, 5 nm. The film thickness of the GaN in one cycle in the superlattice structure is, for example, 20 nm.

The first semiconductor layer 110 is formed on the buffer layer 102. That is, the first semiconductor layer 110 is formed above the substrate 101. That is, the substrate 101, the buffer layer 102, and the first semiconductor layer 110 are stacked in this order.

The first semiconductor layer 110 is made of a first nitride semiconductor. The first nitride semiconductor is made of, for example, GaN. It is to be noted that the first nitride semiconductor is not limited to be made of GaN, but may be made of another material that is a nitride semiconductor. Moreover, the first nitride semiconductor may be a compound of GaN and other materials. The film thickness of the first semiconductor layer 110 is, for example, 2 μm.

The second semiconductor layer 120 is formed on the first semiconductor layer 110. The second semiconductor layer 120 is made of a second nitride semiconductor. The second nitride semiconductor is made of, for example, AlGaN. It is to be noted that the second nitride semiconductor is not limited to be made of AlGaN, but may be made of another material that is a nitride semiconductor. Moreover, the second nitride semiconductor may be made of a compound of AlGaN and other materials. The film thickness of the second semiconductor layer 120 is, for example, 50 nm.

A bandgap of the second nitride semiconductor is larger than a bandgap of the first nitride semiconductor.

It is to be noted that the second semiconductor layer 120 is formed on the first semiconductor layer 110, so that a heterojunction interface is formed. As a result, in a region in the vicinity of the heterojunction interface in the first semiconductor layer 110, a 2 DEG layer 111 is formed. The 2 DEG layer 111 is a layer formed of 2 DEG.

That is, the 2 DEG layer 111 is formed in a surface portion of the first semiconductor layer 110 which is a region in the vicinity of an interface between the first semiconductor layer 110 and the second semiconductor layer 120.

In the second semiconductor layer 120, openings penetrating the second semiconductor layer 120 (hereinafter also referred to as penetrating regions) are formed. Specifically, in the second semiconductor layer 120, openings 121.1 and 121.2 which penetrate the second semiconductor layer 120 to reach (be in contact with) the first semiconductor layer 110.

The openings 121.1 and 121.2 are formed by a dry etching process. Each of the openings 121.1 and 121.2 has a depth of, for example, 100 nm.

The insulator 130.1 is formed on the upper surface of the first semiconductor layer 110 on at least a part of a portion (hereinafter also referred to as a layer upper surface A) above which the second semiconductor layer 120 is not formed due to the opening 121.1. It is to be noted that the area of the bottom surface of the insulator 130.1 is, for example, from 80% to 100% of the area of the layer upper surface A.

The insulator 130.2 is formed on the upper surface of the first semiconductor layer 110 on at least a part of a portion (hereinafter also referred to as a layer upper surface B) above which the second semiconductor layer 120 is not formed due to the opening 121.2.

It is to be noted that the area of the bottom surface of the insulator 130.2 is, for example, from 80% to 100% of the area of the layer upper surface B.

In the opening 121.1, the source electrode S10 which is an ohmic electrode is formed. That is, in the opening 121.1, an electrode (the source electrode S10) is formed over the insulator 130.1. The source electrode S10 is formed to be in contact with the interface between the first semiconductor layer 110 and the second semiconductor layer 120. Specifically, the source electrode S10 is formed to be in contact with end portions of the interface between the first semiconductor layer 110 and the second semiconductor layer 120. Moreover, the source electrode S10 is formed to penetrate the second semiconductor layer 120 and the 2 DEG layer 111.

Moreover, the source electrode S10 is formed such that the bottom portion of the source electrode S10 reaches a region below the 2 DEG layer 111.

The source electrode S10 is made of mainly Ti and Al. The film thickness of the source electrode S10 is 200 nm.

In the opening 121.2, the drain electrode D10 which is an ohmic electrode is formed. That is, in the opening 121.2, an electrode (the drain electrode D10) is formed over the insulator 130.2. The drain electrode D10 is formed to be in contact with the interface between the first semiconductor layer 110 and the second semiconductor layer 120. Specifically, the drain electrode D10 is formed to be in contact with end portions of the interface between the first semiconductor layer 110 and the second semiconductor layer 120. Moreover, the drain electrode D10 is formed to penetrate the second semiconductor layer 120 and the 2 DEG layer 111.

Moreover, the drain electrode D10 is formed such that the bottom portion of the drain electrode D10 reaches the region below the 2 DEG layer 111.

The drain electrode D10 is mainly made of Al. The drain electrode D10 has a thickness of 200 nm. The source electrode S10 and the drain electrode D10 are sequentially formed.

The gate electrode G10 is formed on the second semiconductor layer 120 and between the source electrode S10 and the drain electrode D10. The gate electrode G10 is a schottky electrode or made of a p-type nitride semiconductor. The p-type nitride semiconductor is made of, for example, p-GaN.

The surface protection film 150 is formed on the source electrode S10, the drain electrode D10, and the gate electrode G10.

In this embodiment, AlN formed by a plasma CVD apparatus is used as a material for the insulators 130.1 and 130.2. Moreover, in this embodiment, the film thickness of each of the insulators 130.1 and 130.2 is 150 nm, and a distance dl between the insulator 130.1 and the 2 DEG layer 111 in an X direction is, for example, 0.5 μm. Moreover, a distance dl between the insulator 130.2 and the 2 DEG layer 111 in the X direction is also, for example, 0.5 μm.

In this embodiment, considering radiation performance, AlN having good radiation performance is used as a material for the insulators 130.1 and 130.2, but the material is not limited to AlN. Another material may be used as long as it functions as an insulator.

Materials for the insulators 130.1 and 130.2 may be, for example, $SiO_2$, SiN, $Al_2O_3$, sapphire, diamond, an insulating organic material, and others. That is, the insulators 130.1 and 130.2 are made of at least one of AlN, $SiO_2$, SiN, sapphire, diamond, and an insulating organic material.

Figure 2:
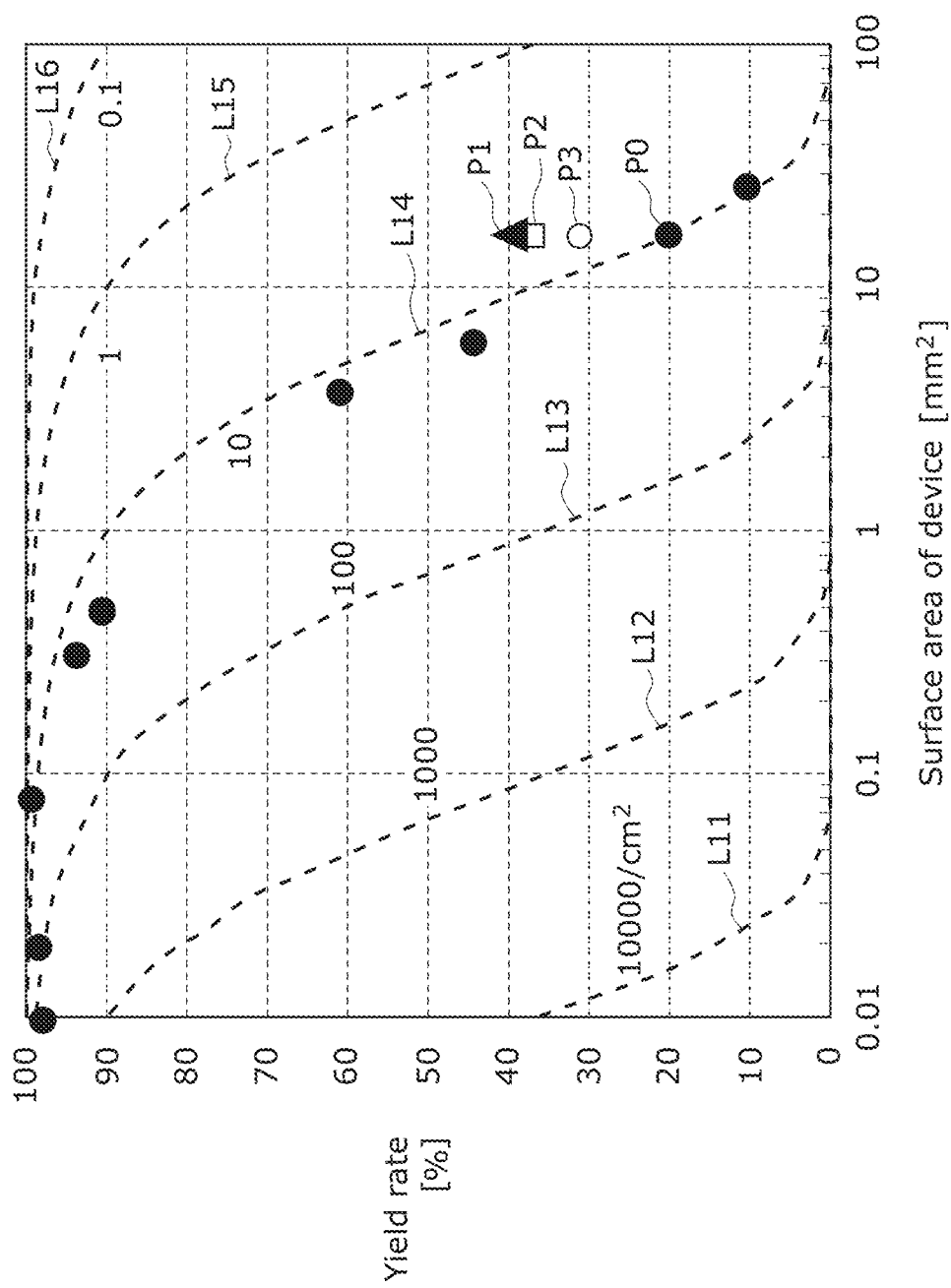
FIG. 2 is a diagram showing the relationship between the surface area and the yield rate of a device.

FIG. 2 is a diagram showing the relationship between the surface area and the yield rate of a device. In FIG. 2, the horizontal axis indicates the surface area of a field-effect transistor, and the vertical axis indicates the yield rate of the field-effect transistor. Hereinafter, the field-effect transistor is referred to as a FET.

Here, the structure of the field-effect transistor 100 is as follows: the distance between the source and the gate $L_{SG}$=1.5 μm, the length of the gate electrode $L_G$=2 μm, the distance between the gate and the drain $L_{GD}$=10 μm, the length of the source electrode $L_S$=8 μm, the length of the drain electrode $L_D$=8 82 m.

The yield rate of the FET is a yield rate in the case where a FET satisfying the following condition A is regarded as "defective". The condition A is that, under a state where the FET is OFF, a leakage current is less than or equal to $10^{-7}$ A/mm when the voltage $V_{DS}$ between the drain and the source is 400 V.

Hereinafter, a defect which causes a decrease in a breakdown voltage in a device (for example, a FET) is also referred to as a breakdown-voltage decreasing defect. The breakdown-voltage decreasing defect is, for example, a pit. It is to be noted that the breakdown-voltage decreasing defect is not limited to a pit, but may be dislocation, a micropipe, or an inversion domain.

Characteristic curves L11, L12, L13, L14, L15, and L16 are theoretical curves each corresponding to the density of breakdown-voltage decreasing defects under an assumption that the breakdown-voltage decreasing defects are present in the device (FET).

The breakdown-voltage decreasing defect assumed to be present in the device (FET), for example, prevents the breakdown voltage of the device (FET) from being 400 V or more. The breakdown-voltage decreasing defect is, for example, a pit. The above-described density of the breakdown-voltage decreasing defects is also the in-plane density of a leak path.

The characteristic curves L11, L12, L13, L14, L15, and L16 correspond to the density of the breakdown-voltage decreasing defects 10000, 1000, 100, 10, 1, 0.1/cm$^2$, respectively.

The characteristic curves L11 to L16 show that a density of the breakdown-voltage decreasing defects which prevents the breakdown voltage in the device (FET) from being 400 V or more is approximately 10/cm$^2$.

In FIG. 2, a property point P1 (a triangle mark) indicates the yield rate of the field-effect transistor 100 (device) in which the insulators 130.1 and 130.2 are formed.

On the other hand, filled circle marks indicate, with regard to FETs having various surface areas, yield rates plotted as functions of the surface areas in the case where the insulators 130.1 and 130.2 are not formed therein. A property point P0 indicates a yield rate of the device (FET) assuming the case where the insulators 130.1 and 130.2 are not formed in the field-effect transistor 100.

FIG. 2 shows that the yield rate indicated by the property point P1 is twice as much as the yield rate indicated by the property point P0 for the same surface area. That is, in the case with the insulators, the yield rate is increased twice as much as the case without the insulators for the same surface area. As described above, it can be seen that the yield rate of the device (FET) is improved by forming the insulators.

COMPARATIVE EXAMPLES

Here, the conventional FET described with reference to FIG. 6 will be examined. As described above, when a breakdown-voltage decreasing defect is present in the first semiconductor layer 510 or the second semiconductor layer 520 in the conventional FET, the breakdown voltage between the breakdown-voltage decreasing defect and the substrate decreases. Here, the breakdown-voltage decreasing defect is, for example, a pit.

As a result, the probability of the breakdown voltage in the FET (device) being less than a predetermined breakdown voltage for determining an acceptable FET (device) increases, and as such, the yield rate of the FET (device) decreases.

Figure 6:
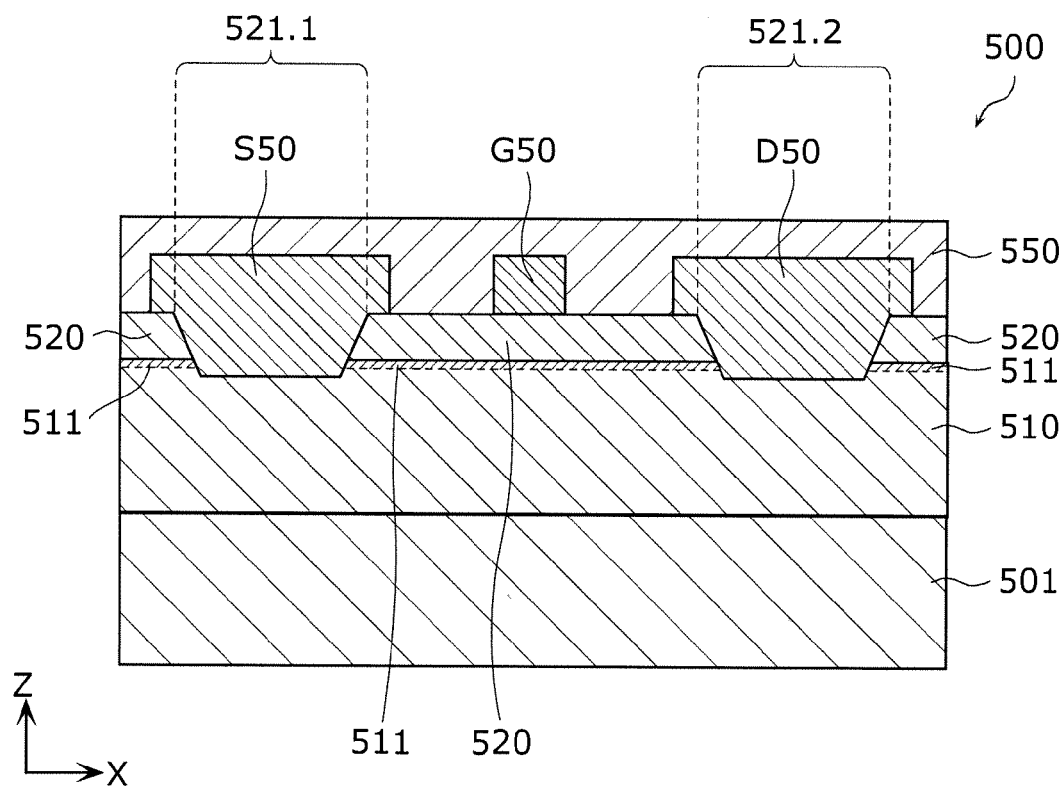
FIG. 6 is a diagram showing a cross-section structure of a conventional field-effect transistor.
Figure 7:
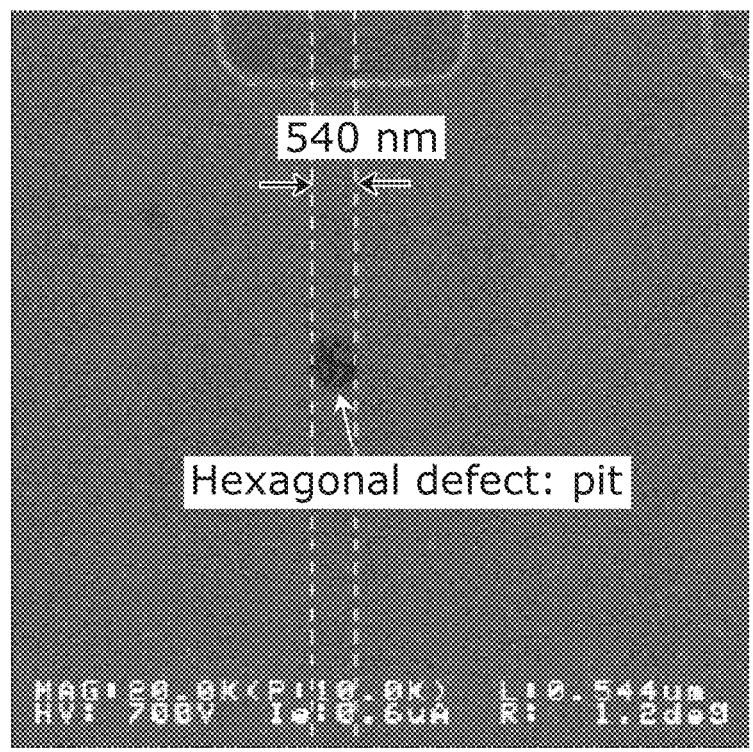
FIG. 7 is an electron micrograph showing a hexagonal pit.

It is to be noted that as the longitudinal length of a gate electrode (the length of the depth direction of the gate electrode G50 in FIG. 6) increases and the effective surface area of the FET (device) increases, the probability of the presence of the breakdown-voltage decreasing defects in the effective surface area of the device increases. Therefore, in order to maintain the probability of the presence of the breakdown-voltage decreasing defect at less than or equal to the predetermined value, the length of the gate electrode should not be unlimitedly long.

Here, the width (length) of the source electrode S50 in an X direction in FIG. 6 is referred to as a source electrode length. Moreover, the width (length) of the drain electrode D50 in an X direction in FIG. 6 is referred to as a drain electrode length.

As a method to decrease the effective surface area of the device as much as possible, shortening the source electrode length and the drain electrode length is possible. However, this method is not preferable because of the reasons A and B below.

The reason A is that this method causes a limitation in the current flowing in the source electrode and the drain electrode.

The reason B is that shortening the source electrode length and the drain electrode length may decrease the radiation performance and deteriorate the characteristics of the device.

Specifically, in the nitride semiconductor field-effect transistor using the 2 DEG, mobility of electrons is reduced as the temperature rises, thereby increasing sheet resistance. Therefore, such a device structure as to decrease the radiation performance is not preferable.

Figure 3:
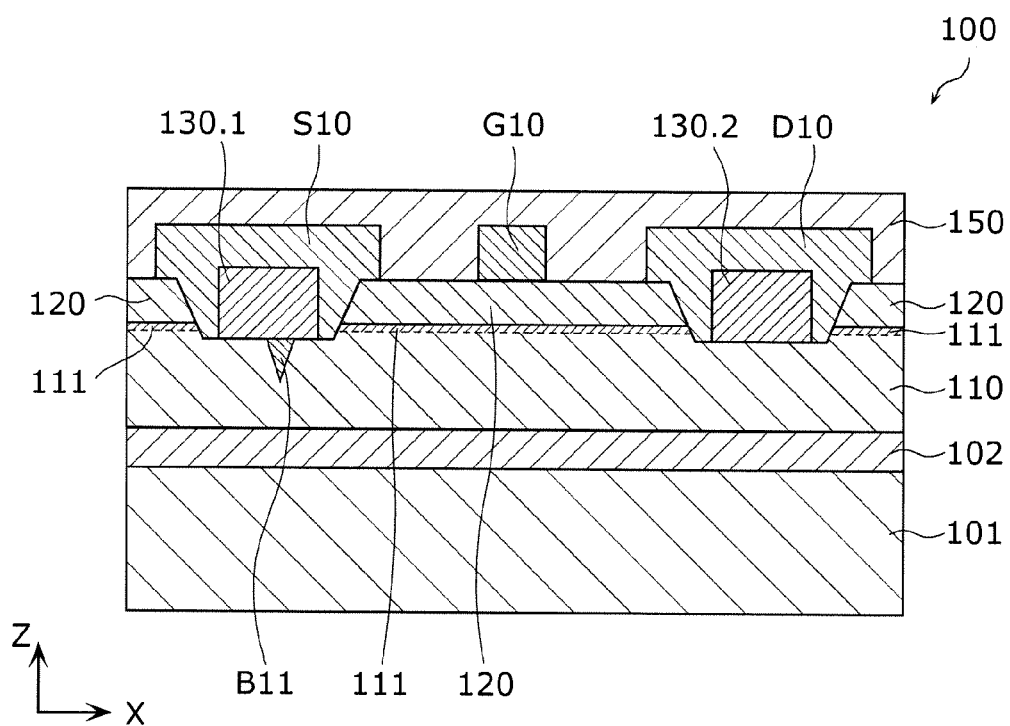
FIG. 3 is a diagram illustrating a field-effect transistor in which a defect is present.

Here, in the field-effect transistor 100 according to this embodiment, it is assumed that a breakdown-voltage decreasing defect B11 is present directly under the insulator 130.1 as shown in FIG. 3. The breakdown-voltage decreasing defect B11 is, for example, a pit.

In this case, even when a voltage is applied to the drain electrode D10, it is possible to maintain the breakdown voltage between the breakdown-voltage decreasing defect B11 and the substrate 101 because the insulators 130.1 and 130.2 are present.

In other words, it is possible to suppress the decrease in the breakdown voltage between the breakdown-voltage decreasing defect B11 and the substrate 101.

It is to be noted that the breakdown-voltage decreasing defect B11 is assumed to be present directly under the insulator 130.2 in the field-effect transistor 100. In this case, even when a voltage is applied to the drain electrode D10, it is possible to maintain the breakdown voltage between the breakdown-voltage decreasing defect B11 and the substrate 101 because the insulator 130.2 is present.

With this, even when the defect which can cause the decrease in the breakdown voltage is present, it is possible to suppress a decrease in the probability of the field-effect transistor 100 maintaining the breakdown voltage more than or equal to the predetermined breakdown voltage for determining an acceptable FET (device).

In other words, the decrease in the yield rate of the field-effect transistor 100 can be suppressed.

Moreover, the ohmic electrodes (the source electrode S10 and the drain electrode D10) are directly in contact with the 2 DEG layer 111. As a result, the contact resistance between the ohmic electrodes (the source electrode S10 and the drain electrode D10) and the 2 DEG layer 111 is not influenced by the presence of the insulators 130.1 and 130.2. Therefore, static characteristics of the device are not influenced at all.

According to the structure of the field-effect transistor 100 in this embodiment, by increasing the gate width, it is possible to maintain a desired breakdown voltage in the field-effect transistor 100 even when the field-effect transistor 100 has a large effective surface area. That is, it is possible to suppress the decrease in the probability of the field-effect transistor 100 maintaining the breakdown voltage more than or equal to the predetermined breakdown voltage for determining an acceptable FET (device). In other words, the decrease in the yield rate of the field-effect transistor can be suppressed.

Therefore, according to the structure of the field-effect transistor 100 in this embodiment, the yield rate can be improved.

Embodiment 2

Figure 4:
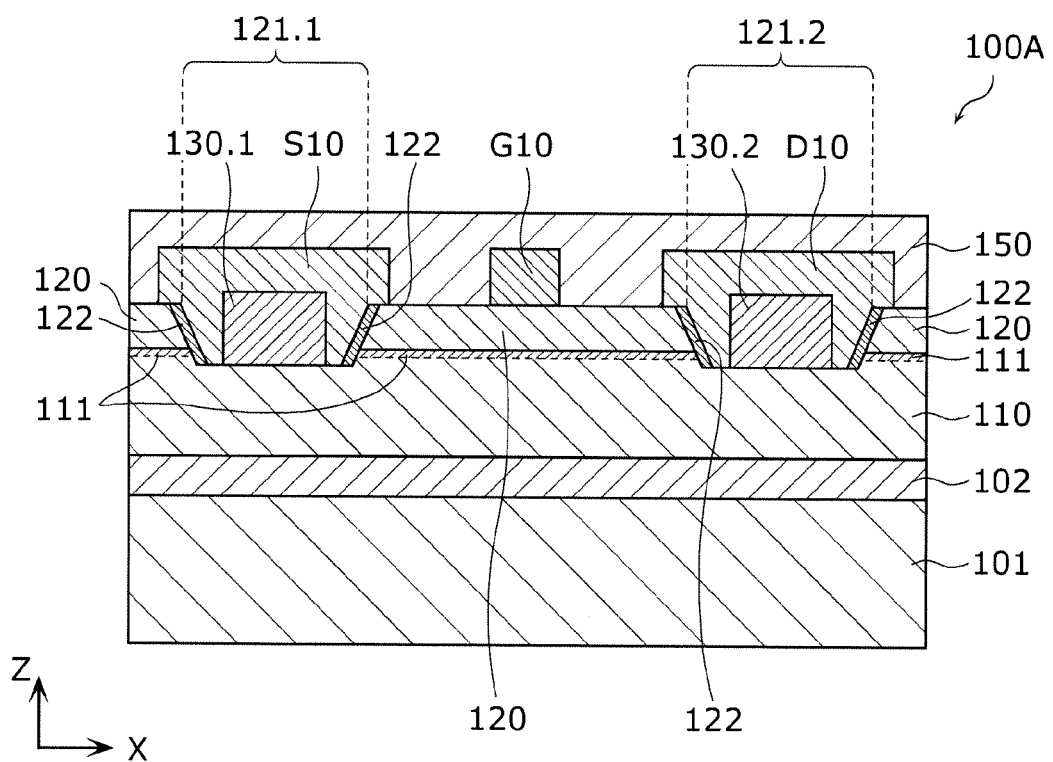
FIG. 4 is a diagram showing a cross-section structure of a field-effect transistor according to Embodiment 2.

FIG. 4 is a diagram showing a cross-section structure of a field-effect transistor 100A according to Embodiment 2.

The field-effect transistor 100A is different from the field-effect transistor 100 in FIG. 1 in that a region 122 doped with an n-type impurity is formed. Since the rest of the structure of the field-effect transistor 100A is the same as that of the field-effect transistor 100, detailed descriptions are not repeated. Moreover, since materials of constituent elements of the field-effect transistor 100A are also the same as those of the field-effect transistor 100, detailed descriptions are not repeated.

Hereinafter, each of the openings 121.1 and 121.2 is also referred to as an opening 121 as a whole.

Specifically, the n-type impurity is doped to a portion (the region 122) corresponding to the inner surface of the opening 121 in the first semiconductor layer 110 and the second semiconductor layer 120.

The n-type impurity is, for example, silicone (Si). In the doping of the n-type impurity, the concentration of the n-type impurity is $10^{-18}$ cm$^{-3}$.

More specifically, the n-type impurity is doped to a portion (the region 122) corresponding to the inner surface of the opening 121.1 in the first semiconductor layer 110 and the second semiconductor layer 120. The portion corresponding to the inner surface of the opening 121.1 includes an end portion of the interface between the first semiconductor layer 110 and the second semiconductor layer 120. That is, the n-type impurity is doped to a portion (the region 122) where the source electrode S10 (the ohmic electrode) and the 2 DEG layer 111 are in contact with each other.

With this, the contact resistance between the source electrode S10 (the ohmic electrode) and the 2 DEG layer 111 is decreased.

Moreover, the n-type impurity is doped to a portion (the region 122) corresponding to the inner surface of the opening 121.2 in the first semiconductor layer 110 and the second semiconductor layer 120. Here, the portion corresponding to the inner surface of the opening 121.2 includes an end portion of the interface between the first semiconductor layer 110 and the second semiconductor layer 120. That is, the n-type impurity is doped to a portion where the drain electrode D10 (the ohmic electrode) and the 2 DEG layer 111 are in contact with each other (the region 122).

With this, the contact resistance between the drain electrode D10 (the ohmic electrode) and the 2 DEG layer 111 is decreased.

It is to be noted that as in Embodiment 1, the material of the insulators 130.1 and 130.2 is AlN, and the film thickness of the insulators 130.1 and 130.2 is 150 nm in this embodiment. Moreover, a distance d1 (refer to FIG. 1) between the insulator 130.1 (the insulator 130.2) and the 2 DEG layer 111 in the x direction is, for example, 0.5 µm.

It is to be noted that as in Embodiment 1, the structure of the field-effect transistor 100A is as follows: the distance between the source and the gate $L_{SG}$=1.5 µm, the length of the gate electrode $L_G$=2 µm, the distance between the gate and the drain $L_{GD}$=10 µm, the length of the source electrode $L_S$=8 m, the length of the drain electrode $L_D$=8 µm in this embodiment.

The yield rate of the FET is, as in Embodiment 1, a yield rate in the case where a FET satisfying the above condition A is regarded as "defective".

In FIG. 2, a property point P2 (a blank square mark) indicates the yield rate of the field-effect transistor 100A in which the insulators 130.1 and 130.2 are formed.

FIG. 2 shows that the yield rate indicated by the property point P2 is twice as much as the yield rate indicated by the property point P0 for the same surface area. In other words, the yield rate of the field-effect transistor with the insulator is twice as much as the yield rate of the field-effect transistor without the insulator. As described above, an improvement in the yield rate can be achieved in the field-effect transistor 100A in this embodiment, too.

Moreover, according to the structure of the field-effect transistor 100A in this embodiment, it is possible to suppress a decrease in the yield rate of the field-effect transistor 100A as in Embodiment 1.

Embodiment 3

Figure 5:
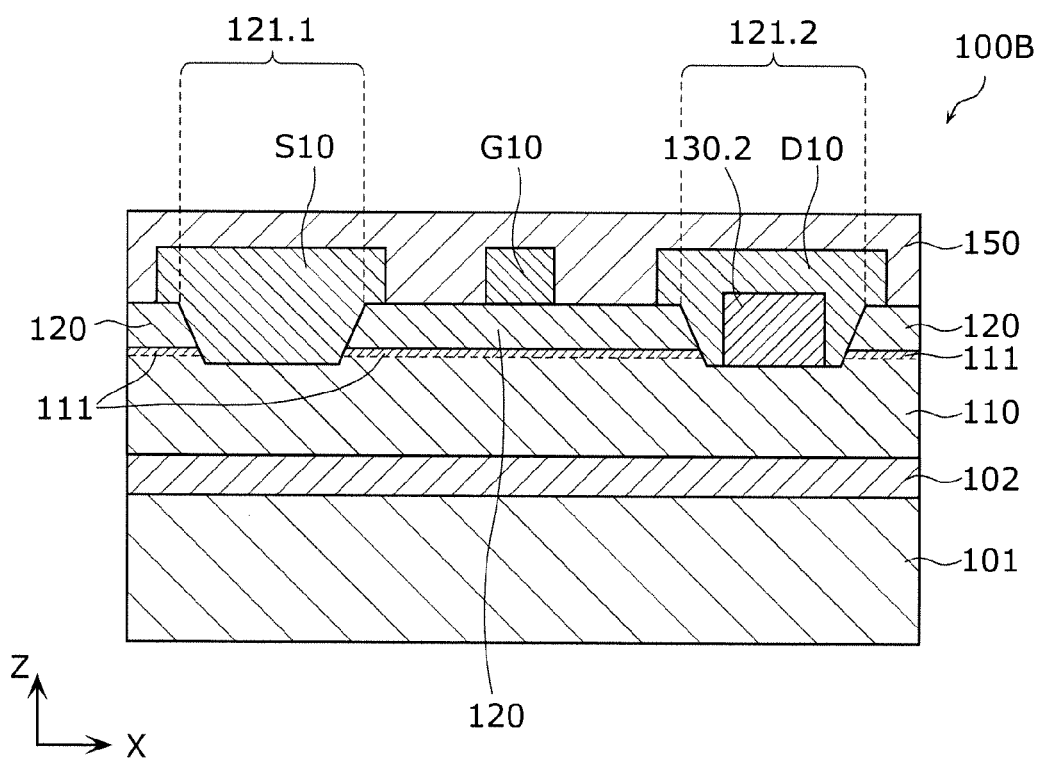
FIG. 5 is a diagram showing a cross-section structure of a field-effect transistor according to Embodiment 3.

FIG. 5 is a diagram showing a cross-section structure of a field-effect transistor 100B according to Embodiment 3.

The field-effect transistor 100B is different from the field-effect transistor 100 in FIG. 1 in that the insulator 130.1 is not formed in the opening 121.1. Since the rest of the structure of the field-effect transistor 100B is the same as that of the field-effect transistor 100, detailed descriptions are not repeated. Moreover, since materials of constituent elements of the field-effect transistor 100B are also the same as those of the field-effect transistor 100, detailed descriptions are not repeated.

That is, among the insulators 130.1 and 130.2, only the insulator 130.2 is formed in the field-effect transistor 100B. It is to be noted that the structure is not limited to this, but only the insulator 130.1 among the insulators 130.1 and 130.2 may be formed in the field-effect transistor 100B.

It is to be noted that as in Embodiment 1, the material of the insulator 130.2 is AlN, and the film thickness of the insulator 130.2 is 150 nm. Moreover, a distance d1 (refer to FIG. 1) between the insulator 130.2 and the 2 DEG layer 111 in the x direction is, for example, 0.5 µm.

It is to be noted that as in Embodiment 1, AlN having good radiation performance is used as a material for the insulator 130.2 considering radiation performance, but the material is not limited to AlN. Another material may be used as long as it functions as an insulator. The Material for the insulator 130.2 may be, for example, SiO2, SiN, $Al_2O_3$, sapphire, diamond, an insulating organic material, and others.

It is to be noted that as in Embodiment 1, the structure of the field-effect transistor 100B is as follows: the distance between the source and the gate $L_{SG}$=1.5 µm, the length of the gate electrode $L_G$=2 µm, the distance between the gate and the drain $L_{GD}$=10 µm, the length of the source electrode $L_S$=8 µm, the length of the drain electrode $L_D$=8 µm in this embodiment.

The yield rate of the FET is, as in Embodiment 1, a yield rate in the case where a FET satisfying the above condition A is regarded as "defective".

In FIG. 2, a property point P3 (a blank circle mark) indicates the yield rate of the field-effect transistor 100B in which the insulator 130.2 is formed. FIG. 2 shows that the yield rate indicated by the property point P3 is 1.5 times as much as the yield rate indicated by the property point P0 for the same surface area. Accordingly, an improvement in the yield rate can be achieved in the field-effect transistor 100B in this embodiment, too.

Moreover, according to the structure of the field-effect transistor 100B in this embodiment, it is possible to suppress a decrease in the yield rate of the field-effect transistor 100B as in Embodiment 1.

Although the field-effect transistor according to the present invention has been described based on the embodiments, the present invention is not limited to the above embodiments. Without materially departing from the scope of the present invention, modifications to the embodiments that are conceived by the person skilled in the art and other embodiments obtainable by combining the constituent elements in the different embodiments may be included within the scope of the present invention.

It is to be understood that the disclosed embodiments are illustrative and not restrictive in all respects. The scope of the present invention is indicated not by the above description but by the claims, and is intended to include equivalents of the claims and all modifications within the scope of the claims.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The field-effect transistor according to the present invention can be used as a power transistor used in a power circuit of consumer equipment including an air conditioner, a lighting apparatus, and others.

The invention claimed is:

1. A field-effect transistor comprising:
a substrate;
a first semiconductor layer formed above the substrate and made of a first nitride semiconductor;
a second semiconductor layer formed above the first semiconductor layer and made of a second nitride semiconductor having a band gap larger than a band gap of the first nitride semiconductor;
an opening formed in the second semiconductor layer, the opening penetrating the second semiconductor layer to reach the first semiconductor layer;
an insulator formed on an upper surface of the first semiconductor layer on at least a part of a portion above which the second semiconductor layer is not formed due to the opening; and
an electrode formed in the opening to cover the insulator and to be in contact with an interface between the first semiconductor layer and the second semiconductor layer.

2. The field-effect transistor according to claim 1, further comprising
a two-dimensional electron gas layer formed on a surface portion of the first semiconductor layer, the surface portion being a region in a vicinity of the interface between the first semiconductor layer and the second semiconductor layer,
wherein the electrode is formed to penetrate the second semiconductor layer and the two-dimensional electron gas layer.

3. The field-effect transistor according to claim 1,
wherein in the first semiconductor layer and the second semiconductor layer, a portion corresponding to an inner surface portion of the opening is doped with an n-type impurity.

4. The field-effect transistor according to claim 3,
wherein the portion corresponding to the inner surface portion of the opening includes an end portion of the interface between the first semiconductor layer and the second semiconductor layer.

5. The field-effect transistor according to claim 1, further comprising
a buffer layer,
wherein the substrate, the buffer layer, and the first semiconductor layer are stacked in this order.

6. The field-effect transistor according to claim 1,
wherein the insulator is made of at least any one of AlN, $SiO_2$, SiN, sapphire, diamond, and an insulating organic material.

* * * * *